United States Patent
Cheu et al.

(10) Patent No.: US 6,803,327 B1
(45) Date of Patent: Oct. 12, 2004

(54) COST EFFECTIVE POLYMIDE PROCESS TO SOLVE PASSIVATION EXTRUSION OR DAMAGE AND SOG DELMINATES

(75) Inventors: Shih-Shiung Cheu, Hsin-Chu (TW); Yea-Dean Sheu, Hsin-Chu (TW); Chih-Heng Shen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/285,986

(22) Filed: Apr. 5, 1999

(51) Int. Cl.[7] .................. H01L 21/4763; H01L 21/44; H01L 21/31; H01L 21/469
(52) U.S. Cl. .................. 438/781; 438/623; 438/688; 438/763; 438/958
(58) Field of Search .................. 438/781, 623, 438/688, 763, 958, 974

(56) References Cited

U.S. PATENT DOCUMENTS

| | | | |
|---|---|---|---|
| 4,733,289 A | 3/1988 | Tsurumaru | 357/54 |
| 5,013,689 A | 5/1991 | Yamamoto et al. | 437/229 |
| 5,091,289 A | 2/1992 | Cronin et al. | 430/312 |
| 5,187,119 A | 2/1993 | Cech et al. | 437/187 |
| 5,242,864 A | 9/1993 | Fassberg et al. | 437/228 |
| 5,807,787 A | 9/1998 | Fu et al. | 438/623 |
| 6,066,557 A * | 5/2000 | Lukanc | 438/639 |
| 6,143,668 A * | 11/2000 | Dass et al. | 438/763 |

OTHER PUBLICATIONS

Tummala, Microelectronics Packaging Handbook II, 1997, p. 447–478.*

* cited by examiner

*Primary Examiner*—Chandra Chaudhari
*Assistant Examiner*—Nema Berezny

(57) ABSTRACT

The present invention teaches the deposition of a pattern of interconnecting lines and bond pads. Passivation layers are deposited over this metal pattern. A layer of photosensitive polyimide is deposited over the passivation layers. This layer of photosensitive polyimide is patterned, exposed and developed to expose the underlying bonding pads. The remaining polyimide is cured and cross-linked and remains in place to serve as a buffer during further device packaging. Key to the present invention is that the remaining photosensitive polyimide is not removed after the bond pad has been exposed.

29 Claims, 6 Drawing Sheets

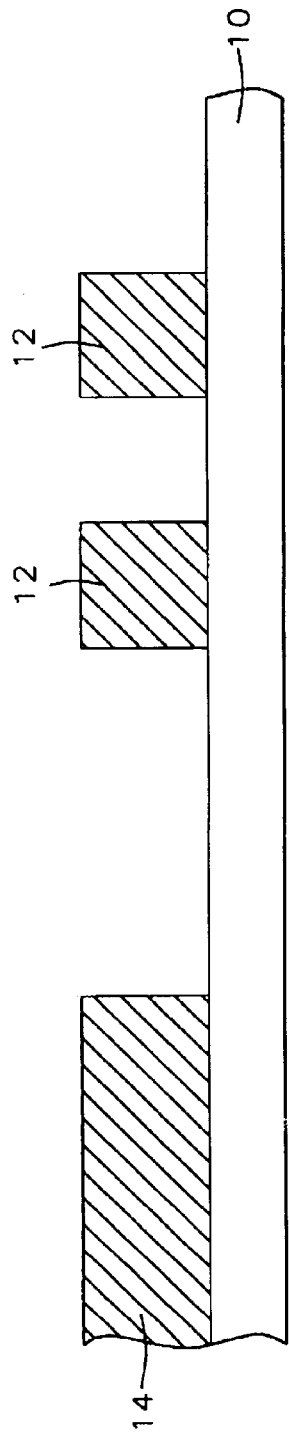
FIG. 1 – Prior Art
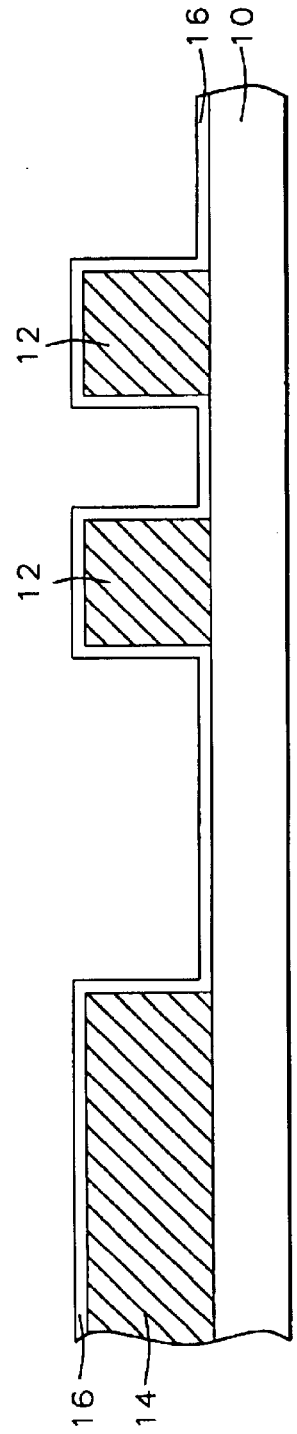
FIG. 2 – Prior Art

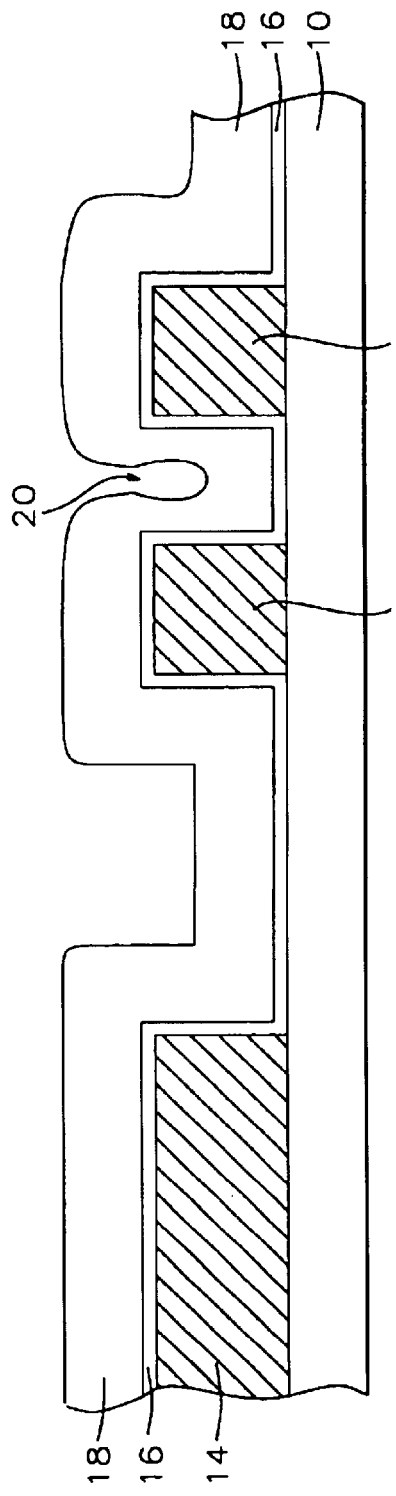
FIG. 3 – Prior Art
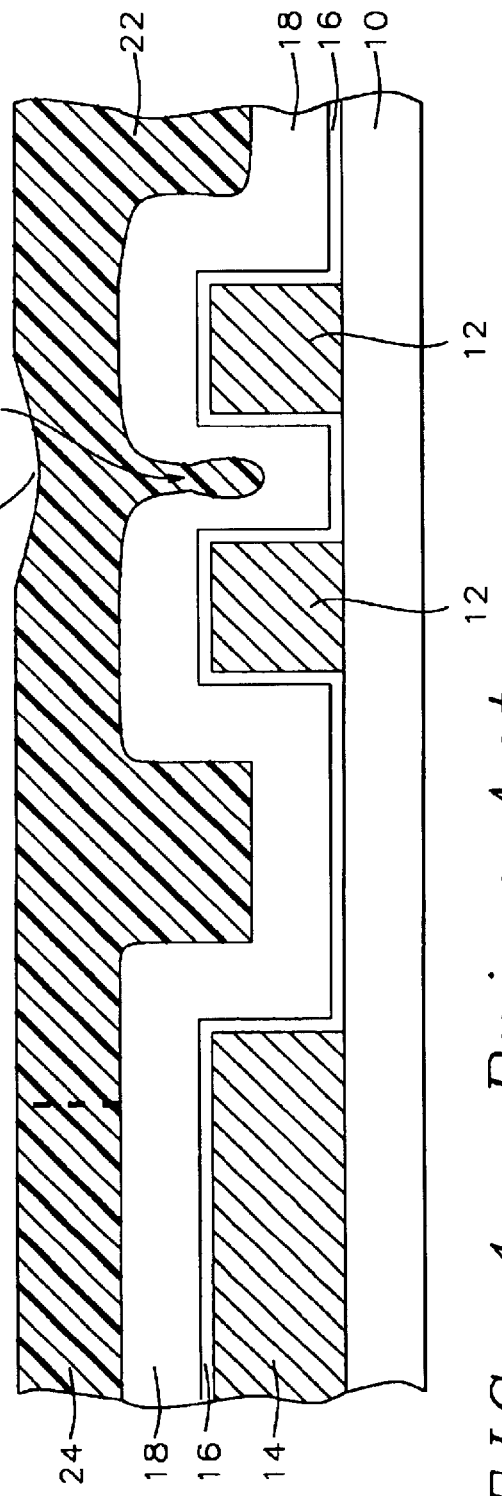
FIG. 4 – Prior Art

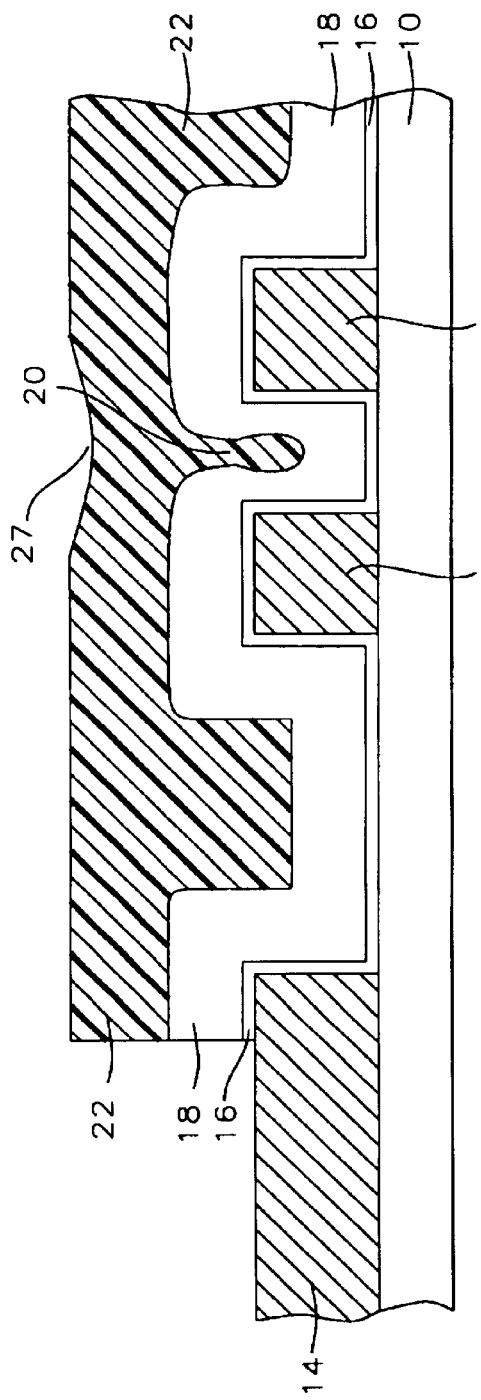
FIG. 5 - Prior Art
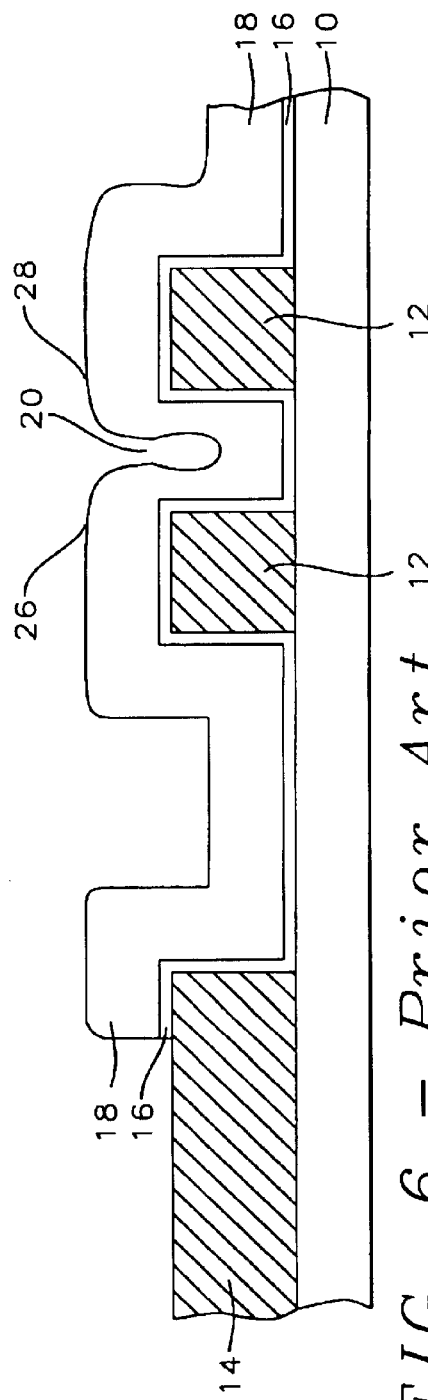
FIG. 6 - Prior Art

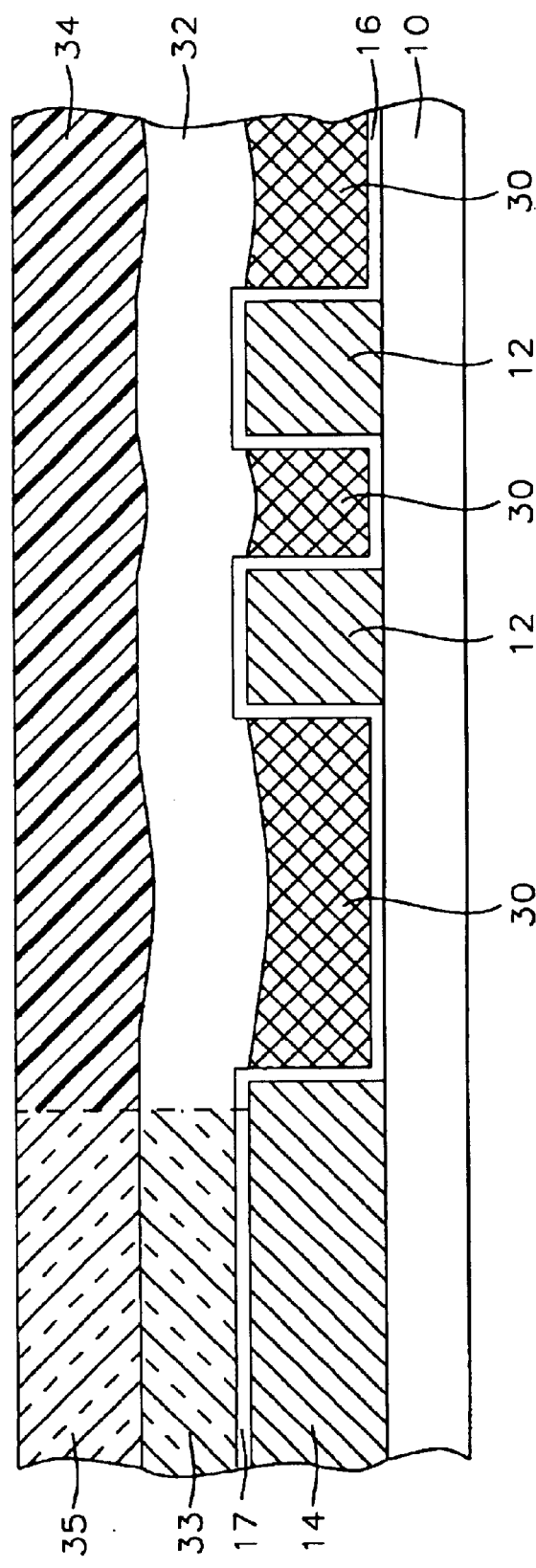
FIG. 7 – Prior Art

COST EFFECTIVE POLYMIDE PROCESS TO SOLVE PASSIVATION EXTRUSION OR DAMAGE AND SOG DELMINATES

BACKGROUND OF THE INVENTION (1) Field of the Invention

The invention relates to the fabrication of Semiconductor integrated circuit devices, and more particularly to a cost effective method for forming a passivation layer on the top surface of interconnecting metal lines such that damage and extrusion in the surface of the passivation layer and SOG delamination over the metal lines are eliminated.

(2) Description of Prior Art

Metal lines of the various layers of conducting lines in a semiconductor device are separated by insulating layers such as silicon oxide and oxygen-containing polymers that are deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads that form electrical interfaces with patterned levels of interconnecting metal lines. Signal lines and power/ground lines can be connected to the bonding pads. After the bonding pads have been created on the surfaces of the chip package, the bonding pads are passivated and electrically insulated by the deposition of a passivation layer over the surface of the bonding pads. Passivation layer can contain silicon oxide/silicon nitride ($SiO_2/Si_3N_4$) deposited by CVD. The passivation layer is patterned and etched to create openings in the passivation layer for the bonding pads after which a second and relatively thick passivation layer is deposited that further insulates and protects the surface of the chips from moisture and other contaminants and from mechanical damage during the final assembling of the chips. The chips are diced and further assembled on a single or multiple chip carrier, electrical contacts are then further established to the chips via the chip bonding pads.

The trend in the semiconductor industry to create ever denser circuit packages has resulted in packaging many integrated circuit chips in one package and to provide electrical interconnects between the chips within the package. One frequently used method where multiple chips are mounted in one package is the creation of a multi chip module (MCM). This approach has led to the creation of a multilayer structure in the MCM where active chips form the module and the chips are interconnected with a pattern of conducting lines. The conducting lines typically contain doped polysilicon, refractory metal silicides and metal. Via holes are provided that interconnect different layers of conducting lines. Typical dimensions for the conducing lines are a width of 6 to 20 um and a height of 5 to 10 um, conducting lines tend to be narrow in width and thick in the vertical direction. Signal lines are created in such a way as to reduce electrical cross talk between adjacent lines which requires that the conducting lines intersect under a 90-degree angle. To achieve proper creation of the layers of conducting lines and to minimize electrical interference between lines of different layers while at the same time meeting requirements of inter-layer insulation and device reliability, the different layers of conducting line patterns must be created in planes that are essentially flat and have good planarity.

Various materials have found application in the creation of passivation layers. Passivation layer can contain silicon oxide/silicon nitride ($SiO_2/Si_3N_4$) deposited by CVD, passivation layer can be a photosensitive polyimide or can comprise titanium nitride. Another material often used for passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure such as the ability to fill openings of high aspect ratio, a relatively low dielectric constant (about 3.2), a simple process required for the depositing of a layer of polyimide, the reduction of sharp features or steps in the underlying layer, high temperature tolerance of cured polyimide. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross linked thereby leaving unexposed regions (that are not cross linked) over the bonding pads. During subsequent development, the unexposed polyimide precursor layer (over the bonding pads) is dissolved thereby providing openings over the bonding pads. A final step of thermal curing leaves a permanent high quality passivation layer of polyimide over the substrate.

For 0.5 um. and sub-half micron technologies, the spacing of the top metal becomes small enough to cause the creation of microscopic openings (keyholes) within the surface of deposited layers of passivation layers of Plasma Enhanced Oxide (PEOXIDE) or Plasma Enhanced Silicon Nitride ($PESi_3Ni_4$). The subsequently deposited photo resist that defines a passivation pattern will flow into these keyholes resulting in decreased thickness of the photo resist layer in the areas of the keyholes. This may result in damage to the passivation film during etching of the photoresist. The removal of the photoresist is a wet and dry strip process; Act 690 and NMP are used during this process and will also accumulate in the keyhole. The final step of alloying the remaining passivation layer requires elevated temperatures. The (in the keyhole) accumulated photoresist combined with the remnants of Act 690 and NMP (in the keyhole) evaporate at these elevated temperatures causing a violent chemical reaction and the extrusion of the photoresist from the keyhole.

FIGS. 1 through 7 show Prior Art processes used for the deposition of passivation layers over metal layers with the creation of bond pad contact.

FIG. 1 shows a Prior Art pattern of the top layer 12 of metal for interconnecting lines and the top layer 14 of metal for the formation of a bond pad. The layers of metal are deposited on the surface of a substrate 10.

Conventional semiconductor device processing calls for the deposition of passivation layer over the entire top surface of the wafer. The passivation layer forms an insulating, protective layer that shields and protects the surface that it covers from mechanical and chemical damage during subsequent device assembly and packaging. The passivation layer must therefore have good adhesion to the underlying metal and any level of interlevel dielectric over which it is deposited, it must provide uniform step coverage so as not to hinder subsequent steps of planarization, it must be deposited in a uniform thickness, it must protest against mechanical damage such as surface scratch while it must also protect against moisture penetration, it must not introduce stress related problems while easy patterning of the passivation layer is required. It is clear that, in order to meet the requirements that are placed on the passivation layer; the passivation layer must be thick. In many applications, the passivation layer is therefore created using two depositions of passivation material.

FIG. 2 shows the deposition of a first passivation layer 16 of Plasma Enhanced oxide. This layer 16 is a blank deposition over the pattern 12 of the top layer metal for the interconnections and over the top layer metal 14 for the bond pad. The layer 16 of PE oxide typically is about 2000 Angstrom thick. Layer 16 reduces the mechanical stress and the hydrogen content of the overall passivation layer.

FIG. 3 shows the deposition of a second passivation layer 18 of Plasma Enhanced $Si_3Ni_4$ over the first passivation layer 16. This second passivation layer typically is about 7000 Angstrom thick. This nitride layer protects the underlying device against environmental impact such as mechanical scratch, mobile ion impurities such as sodium atoms and against high environmental humidity. Where the spacing between the pattern of interconnect lines 12 is very small, that is 0.5 um or sub-half micron, the spacing is narrow enough that keyholes 20 will be formed on the top surface of the deposited passivation layer 18. As keyholes are defined any surface irregularities that appear in the surface of the passivation layer. These irregularities, when observed in cross section, often have the profile of a keyhole and are therefore generally referred to as keyhole formations. Keyholes may, at times, not be directly apparent or visible on the surface of the passivation layer as open areas or pitting in the surface. Keyholes can also be hidden below the surface of the passivation layer and can demonstrate their existence by causing poor planarization of the surface of the passivation layer.

After the creation of the passivation layer, the passivation layer must now be patterned whereby the passivation layer stays in place over the regions of the interconnecting metal (for the reasons mentioned above) while openings are created for bonding pads. The bonding contact mask is used for this purpose.

FIG. 4 shows the next step in the definition and creation of a bonding pad. A layer 22 of photoresist is deposited over the passivation layer 18; this layer 22 of photoresist is patterned (24) for the bonding pad 14. During the deposition of the photoresist, the photoresist 22 will flow into the keyholes 20 and cause a thinning in area 27 of the photoresist where the keyhole exists.

The pattern 24 of photoresist is defined through exposure and develop. The removal of the photoresist exposes the areas of the planarization layers 16 and 18 that are above the bonding pad 16.

FIG. 5 shows after the passivation etch whereby the passivation layers 16 and 18 have been etched down to the bonding pad 14. A wet or dry etch can be used for the etching of the passivation layer. Typically, dry etch is recommended due to metal corrosion concerns. After the passivation etch has been completed, the remainder of the photoresist will be removed.

FIG. 6 shows a cross section after the photoresist has been removed. The keyhole 20 caused a thinning of the photoresist around the keyhole in area 27 (FIG. 5). The etching of the photoresist may therefore damage the underlying passivation layer in areas 26 and 28 of the passivation layer 18. The removal of the photoresist may also not remove all photoresist that is in the keyhole 20 due to the narrow opening of the keyhole 20.

The strip of photoresist layer 22 includes a wet strip and a dry strip process. The wet strip applies in sequence Act 690, NMP, a DI rinse and a spin-dry step. The following dry strip is an $O_2$ plasma strip at PSC. During this photoresist strip process, Act 690 and NMP will also flow into the keyhole and may, due to the narrow opening of the keyhole, not be easy to remove from the opening. After the completion of the above wet and dry strip processing steps (to remove the photoresist layer) there remains in the keyhole a mixture of left-over photoresist (photoresist that could not be reached due to the narrow entrance to the keyhole) with the Act 690 and NMP that entered the keyhole during the photoresist strip process.

Act 690 is a lift-off resist stripper and contains dimethyl sulfoxide and monoethanol-ammine.

NMP is a solvent-type stripper and contains N-Methylpyrolidinone.

A final alloy step is required for the curing of the passivation layer. This step takes place at temperatures up to 410 degrees C. During this alloy step the remnant Act 690 and NMP in the keyhole evaporates causing a violent chemical reaction resulting in the residue Act 690 and NMP to explode and extrude the remaining photoresist from the keyhole.

Prior Art can also use, within the above-indicated processing sequence, the deposition of a layer of SOG. FIG. 7 further highlights this approach. A interconnecting lines top layer metal pattern 12 with a bond pad top layer metal 14 for the bond pad is created as before, a passivation layer 16 of 2000 Angstrom of PE oxide is deposited over the metal pattern and the exposed surface of the substrate. Next a 3150-Angstrom thick layer 30 of SOG 314 is spin-coated; the objective of this layer is to enhance planarization of the keyholes and thereby to solve the above-indicated effects of passivation layer damage and photoresist extrusion from the keyhole. Over the layer 30 of SOG 314 a 7000-Angstrom thick layer 32 of PE $Si_3N_4$ is deposited and the process continues as indicated above, FIGS. 4 through 6. That is a layer 34 of photoresist is spin-coated, this layer is patterned (35) for the bonding pad 14, the layer 32 of PE $Si_3N_4$ is removed (33) above the bonding pad 12, the passivation layer 16 is removed (17) above the bond pad 14, the photoresist (34) is removed and a final alloy step is applied to the remainder of layer 32 of PE $Si_3N_4$.

The disadvantage of this approach is the additional cost of the SOG material and the required additional processing steps of SOG coating and SOG curing. Furthermore, SOG has the tendency to delaminate during subsequent packaging under high stress, which is highly detrimental to overall device reliability.

U.S. Pat. No. 4,733,289 (Tsurumaru) shows a resin-molded device using polyimide and nitride for passivation.

U.S. Pat. No. 5,242,864(Fassberg et al.) shows a polyimide protection layer.

U.S. Pat. No. 5,013,689(Yamamoto) shows a light sensitive polyimide layer used a passivation layer.

U.S. Pat. No. 5,091,289(Cronin et al.) shows a photosensitive polyimide composition.

U.S. Pat. No. 5,187,119(Cech et al.) shows a photosensitive polyimide and planarization process.

U.S. Pat. No. 5,807,787(Fu et al.) discloses a polyimide Passivation.

SUMMARY OF THE INVENTION

A principle objective of the present invention is to eliminate the negative effect that passivation layer imperfections have on device reliability.

Another objective of the present invention is to adapt planarization technology to ultra-small line spacing technologies.

Another objective of the present invention is to eliminate the effect of the formation of keyholes in dielectrics deposited within ultra-small line spacing.

Another objective of the present invention is to eliminate damage of cracking and delamination in the passivation layer caused by Spin-On-Glass technology.

Another objective of the present invention is to eliminate the Spin-On-Glass processing step.

Another objective of the present invention is to allow the deposition of thick and cross-link polyimide film thus preventing etching damage to the passivation layer.

Another objective of the present invention is to allow not having to remove the polyimide film from the wafer after etching thus further reducing the negative effect of keyhole extrusions.

The present invention teaches the creation of a pattern of top level metal for interconnecting lines and bond pads. A double layer of passivation is formed over the metal patterns, the present invention teaches the deposition of a thick layer of photosensitive polyimide over the passivation layers. This thick layer of photosensitive polyimide is patterned to expose the underlying bonding pads.

Key to the present invention is that the photosensitive polyimide is, after patterning for the bonding pad, not removed from the surface of the passivation layers. This thick layer of polyimide provides excellent protection of the passivation film that remains in place above the interconnecting lines. The polyimide further reduces stress during device packaging and it solves the problem of (the Prior Art) delamination of the SOG. The step of photoresist stripping has also been eliminated.

BRIEF DESCRIPTION OF THE DRAWING

FIG. 1 shows a cross section of the formation of a Prior Art metal pattern for interconnecting lines and a bond pad.

FIG. 2 shows a cross section of the Prior Art deposition of the first passivation layer.

FIG. 3 shows a cross section of the Prior Art deposition of the second passivation layer with the formation of a keyhole.

FIG. 4 shows a cross section of the Prior Art deposition of a photoresist layer with the patterning of this photoresist layer for the bond pad.

FIG. 5 shows a cross section of the Prior Art etching of the passivation layers.

FIG. 6 shows a cross section after Prior Art photoresist strip.

FIG. 7 shows the cross section of Prior Art SOG planarization.

DESCRIPTION OF THE PREFERRED EMBODIMENT

Figure 8:
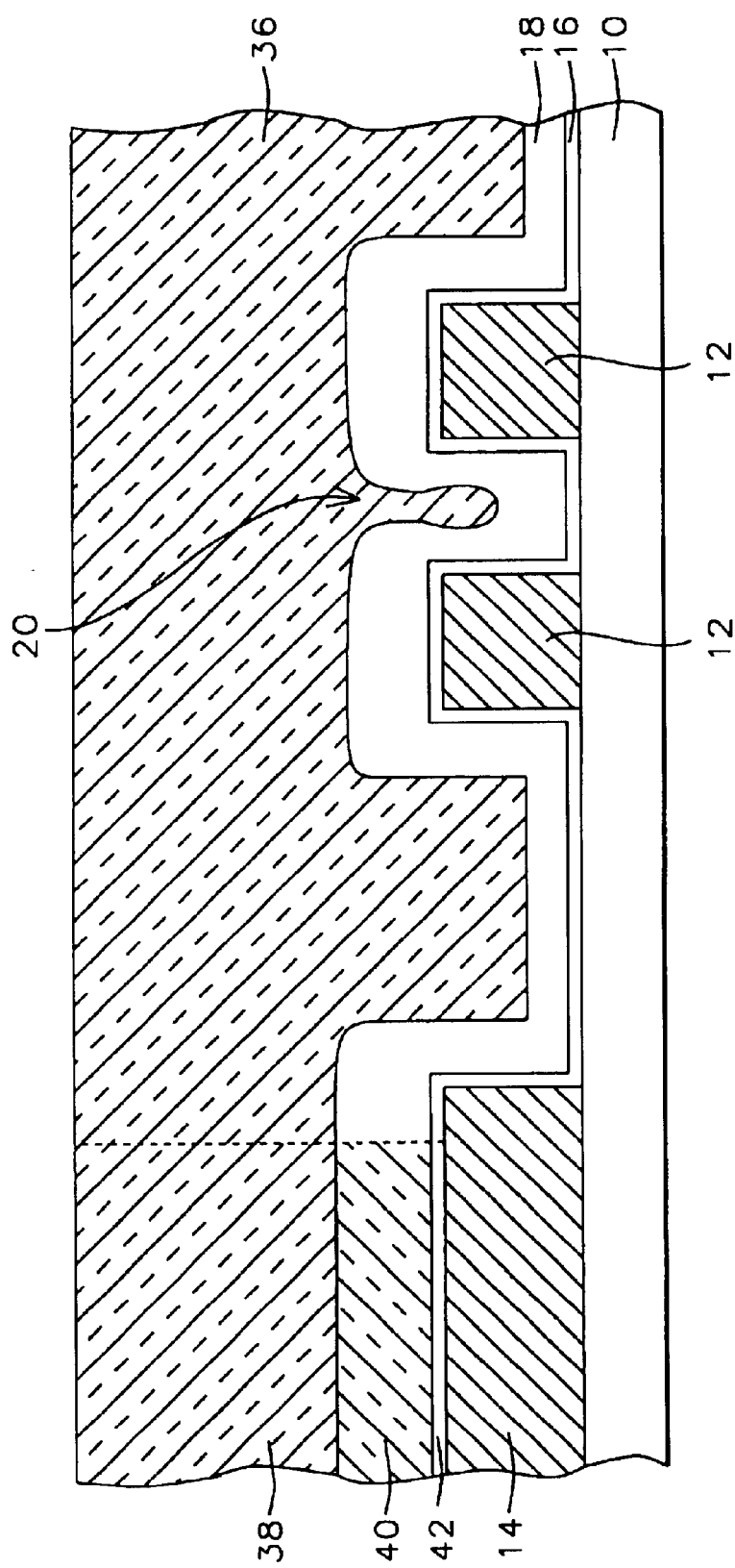
FIG. 8 shows a cross section of the deposition of passivation layers, the deposition of a layer of polyimide and the patterning of the bond pad of the invention.

FIG. 8 shows pattern 12 which is the top layer metal for the interconnecting lines and pattern 14 which is the top layer metal for the bond pad.

The layers of metal that form pattern 12 and pattern 14 are deposited on the surface of a substrate 10.

The pattern of interconnect lines 12 and the bond pad 14 can also be created on a base layer of $SiO_2$ that has been created on the surface of a substrate. This base layer of $SiO_2$ is created prior to the creation of the metal layers thereby cushioning the transition of stress between the silicon substrate and the metal layers 12 and 14. In addition, the interconnecting metal and the bond pad metal can be formed on top of any layer of a semiconductor device other than the surface of a semiconductor substrate. Furthermore, the top level interconnecting metal and top-level bond metal can be formed selectively on a bare main surface of a semiconductor substrate in which a desired circuit element is being formed.

The top layers of metal for the interconnecting lines 12 and the bond pad 14 can contain aluminum or an aluminum/copper (Al/Cu) alloy. The thickness of the bond pad 14 is equal to the thickness of the interconnect lines 12 and is between 4000 and 8000 Angstroms.

A first passivation layer 16 of Plasma Enhanced oxide is deposited over the metal patterns 12 and 14. This first passivation layer 16 is a blank deposition over pattern 12 and over the pattern 14 for the bond pad. The first passivation layer 16 of PE oxide is typically about 2000 Angstrom thick.

The first passivation layer is deposited using PECVD technology at a temperature between about 350 and 450 degrees C. with a pressure of between about 2.0 and 2.8 Torr for the duration between about 8 and 12 seconds.

FIG. 8 further shows the deposition of a second passivation layer 18 of Plasma Enhanced $Si_3N_4$ over the first passivation layer 16. This second passivation layer 18 is typically about 7000 Angstrom thick. Keyhole 20 is again formed between the interconnect line pattern 12.

The second passivation layer 18 is deposited using PECVD technology at a temperature between about 350 and 450 degrees C. with a pressure of between about 4.0 and 5.0 Torr for the duration between about 50 and 60 seconds.

FIG. 8 further shows the deposition of a layer 36 of photosensitive polyimide. The polyimide is spun on in liquid form (a polyamic precursor). It must be noted that layer 36 is a thick layer of polyimide (typically between 5.0 and 9.5 um), the result is that the concavity of keyhole 20 does not cause any significant lack of planarity of the surface of layer 36 above the keyhole 20.

Shrinkage of up to 40% of the thickness of the polyimide can occur after curing of the layer of photosensitive polyimide.

This step of coating of the polyimide is performed at room temperature and ambient pressure for a time of between about 30 and 40 seconds. The indicated processing parameters are not critical since the polyimide thickness is controlled by spin speed.

The layer 36 of polyimide serves as the masking layer for patterning the bond pad 14 and replaces the Prior Art layer of photoresist to define the bond pad 14. The surface of layer 36 of polyimide is exposed to UV light to define bond pad 14, the polyimide 38 that is not exposed to the UV light is removed during developing of the polyimide. The unexposed polyimide is removed during developing with a solvent so that no polyimide etching is required.

Next the 2000 Angstrom layer 42 (the first passivation layer that is above the bond pad) of PE oxide and the 7000 Angstrom layer 40 (the second passivation layer that is above the bond pad) of PE $Si_3N_4$ are etched above the bond pad 14 to expose the surface of the bonding pad 14. The polyimide that is not above the bond pad remains on the wafer and serves as a stress buffer during further device packaging.

Layers 40 and 42 are etched using the same dry etcher.

Layer 42 of the first passivation layer PE oxide is etched (above and aligned with the bond pad) using $Ar/CF_4$ as an etchant at a temperature of between about 120 and 160 degrees C. and a pressure of between about 0.30 and 0.40 Torr for a time of between about 33 and 39 seconds using a dry etch process.

Layer 40 of the second passivation layer of PE $Si_3N_4$ is etched (above and aligned with the bond pad) using $He/NF_3$ as an etchant at a temperature of between about 80 and 100 degrees C. and a pressure of between about 1.20 and 1.30 Torr for a time of between about 20 and 30 seconds using a dry etch process.

The invention offers the added advantage that the remaining passivation film is well protected by the layer of cross-linked thick polyimide and will therefore not be damaged by plasma etching. In addition, no stripping of photoresist is required since the invention leaves the thick layer of polyimide in place to serve as a stress buffer during packaging operations. Therefore, no extrusion takes place during the formation of the bond pad.

Figure 9:
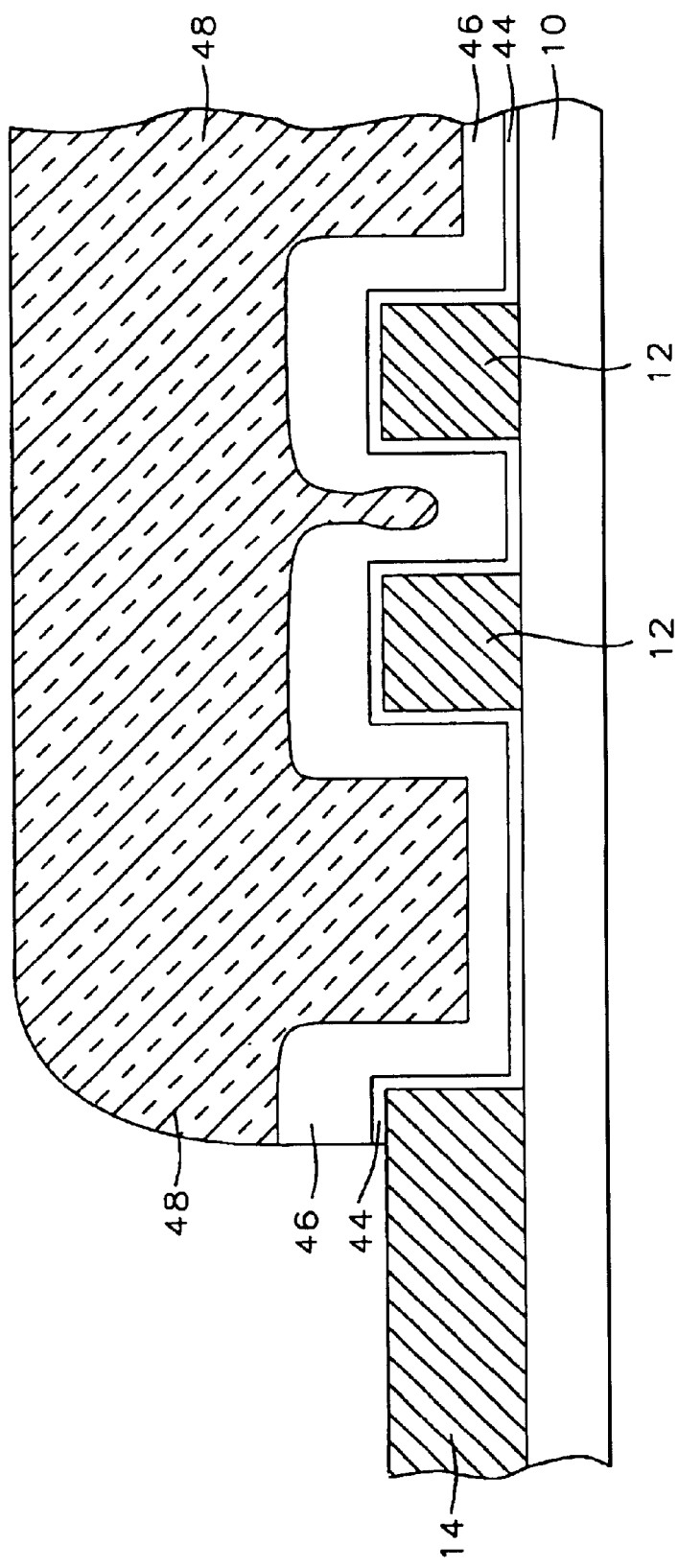
FIG. 9 shows a cross section of the final wafer of the invention.

FIG. 9 shows a cross section of the final wafer configuration. Shown are top level metal 12 for the interconnecting lines, top level metal 14 for the now exposed bond pad, the remainder 44 of the first passivation layer, the remainder 46 of the second passivation layer and the remainder 48 of the thick layer of polyimide. Layer 48 of polyimide is, at the end of the indicated process, submitted to a curing cycle.

The curing of polyimide layer 48 takes place at a temperature of 350 degrees C. in a $N_2$ gas environment for a time of 2 hours and a pressure of 760 Torr.

It must be noted that the use of polyimide films as inter-level dielectrics has been pursued as a technique for providing partial planarization of a dielectric surface. Polyimides offer numerous advantages for such applications such as the filling of small openings without producing voids, the ability to withstand high temperatures without dielectric breakdown, simple processing requirements, they produce surfaces in which the step heights of underlying features are reduced, step slopes which are gentle and smooth and an acceptable dielectric constant.

The created layer 48 of polyimide serves as stress buffer during the packaging process while it also solves the problems of delamination that have been observed when using the SOG planarization process (FIG. 7).

In summation: by replacing the use of photoresist with photosensitive polyimide to define the bond pad, the invention solves:

the problem of surface damage to the passivation layer of interconnecting metal line
the problem of providing a surface stress buffer while not having to remove photoresist
the problem of SOG planarization
the problem of SOG surface cracking and delamination
the problems of an additional polyimide process to reduce stress impact on the surface of the passivation layer of the bonding pad
the problems of keyhole formation on the surface of the planarization layer of the bonding pad Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming bonding pads of a semiconductor substrate comprising the steps of:

providing top level interconnecting metal for interconnecting lines and top level bond pad metal for bond pads, said top level metal being formed selectively on an insulating film overlying the main surface of a semiconductor substrate in which a desired circuit element is being formed, the surface of said insulating film being partially exposed;

depositing a passivation layer over said top-level metal and over the partially exposed surface of said insulating layer, said passivation layer comprising a first and a second passivation layer;

depositing a layer of photosensitive polyimide over said passivation layer, filling keyholes between closely spaced interconnect lines, preventing etching damage and damage of cracking and delamination to the surface of said passivation layer, further providing a stress buffer to said passivation layer, reducing stress impact on the passivation layer;

patterning and etching said layer of photosensitive polyimide thereby forming a pattern for said bonding pads;

patterning and etching said passivation layer thereby exposing said bond pad, said patterning and etching of said passivation layer to take place after said patterning and etching of said layer of photosensitive polyimide; and curing and cross-linking said photosensitive polyimide said curing and cross-linking of said photosensitive polyimide to take place after said patterning and etching of said passivation layer.

2. The method of claim 1 wherein said top level interconnecting metal for interconnecting lines and said top level bond pad metal for bond pads comprises Aluminum.

3. The method of claim 1 wherein said top level interconnecting metal for interconnecting lines and said top level bond pad metal for bond pads comprises aluminum/copper (Al/Cu) alloy.

4. The method of claim 1 wherein the thickness of said bond pad is the thickness of said top level metal said thickness being within the range of between 4000 and 6000 Angstroms.

5. The method of claim 1 wherein said first passivation layer comprises Plasma Enhanced oxide deposited to a thickness of about 2000 Angstrom, said second passivation layer comprises Plasma Enhanced $Si_3N_4$ deposited to a thickness of about 7000 Angstrom.

6. The method of claim 5 wherein said first passivation layer is deposited using PECVD technology at a temperature between about 350 and 450 degrees C. with a pressure of between about 2.0 and 2.8 Torr for the duration between about 8 and 12 seconds.

7. The method of claim 5 wherein said second passivation layer is deposited using PECVD technology at a temperature between about 350 and 450 degrees C. with a pressure of between about 4.0 and 5.0 Torr for the duration between about 50 and 60 seconds.

8. The method of claim 1 wherein the thickness of said photosensitive polyimide is within the range of between 5.0 and 9.5 µm after deposition of said photosensitive polyimide whereby shrinkage of up to 40% of said thickness could occur after curing of said layer of photosensitive polyimide, filling keyholes between closely spaced interconnect lines, preventing etching damage and damage of cracking and delamination to the surface of said passivation layer, further providing a stress buffer to said passivation layer, reducing stress impact on the passivation layer.

9. The method of claim 1 wherein said patterning said layer of photosensitive polyimide is creating a pattern that aligns with said plurality of bond pads.

10. The method of claim 1 wherein said etching said layer of photosensitive polyimide is etching through said photosensitive polyimide down to the surface of said passivation layer thereby removing said photosensitive polyimide above said bond pads.

11. The method of claim 1 wherein said patterning and etching of said photosensitive polyimide is achieved cross-linking with ultra-violet radiation through a mask while masking from UV exposure polyimide regions that align with said bond pads and further dissolving away in a solvent the non-cross-linked polyimide over the bond pads, allowing deposition of a thick and cross-linked polyimide film thus preventing etching damage to the passivation layer.

12. The method of claim 1 wherein that portion of said photosensitive polyimide that remains after completion of said patterning and etching said photosensitive polyimide is not removed but is left in place to serve as a stress buffer and to thereby provide protection against damage and extrusion of that portion of the surface of the passivation layer which is not removed by etching.

13. The method of claim 1 wherein said patterning and etching said passivation layer is removing said first and said second passivation layer above and to the top metal of said bond pads.

14. The method of claim 13 wherein said etching said first passivation layer uses $Ar/CF_4$ as an etchant at a temperature of between about 120 and 160 degrees C. and a pressure of between about 0.30 and 0.40 Torr for a time of between about 33 and 39 seconds using a dry etch process.

15. The method of claim 1 wherein said top level metal for interconnecting lines and top level metal for bond pads are formed within or on top of any layer of a semiconductor device other than or in addition to said semiconductor substrate.

16. The method of claim 1 wherein said top level metal for interconnecting lines and top level metal for bond pads are formed selectively on the bare main surface of a semiconductor substrate in which a desired circuit element is being formed.

17. The method of claim 1 wherein said top level metal for interconnecting lines and top level metal for bond pads are formed within or on top of any layer of a semiconductor device other than or in addition to said semiconductor substrate.

18. The method of claim 1 wherein said top level metal for interconnecting lines and top level metal for bond pads are formed selectively on the bare main surface of a semiconductor.

19. The method of claim 1 wherein said curing and cross-linking said photosensitive polyimide is in a $N_2$ gas ambient at a temperature of between about 300 and 400 degrees C. for a time period between about 1.5 and 2.5 hours.

20. A method of forming planarized bonding pads within the structure of a semiconductor device comprising the steps of:

providing a semiconductor substrate, said semiconductor substrate to contain electrical circuits or other electrical functional electrical components;

providing a wiring layer having wiring and having a plurality of bond pads having a thickness, the wiring of said wiring layer being directly connected to said bond pads in addition to being connected to said electrical circuits or other electrical functional components within said semiconductor substrate, the wiring layer being formed selectively on an insulating film overlying the main surface of a semiconductor substrate in which a desired circuit element is being formed, the surface of said insulating layer being partially exposed;

depositing a layer of top metal over said bond pads thereby depositing bond pad metal;

depositing a passivation layer over said wiring layer and over said bond pad metal and over the exposed surface of the insulating layer;

depositing a layer of photosensitive polyimide over said passivation layer to a thickness within the range of between 5.0 and 9.5 µm, filling keyholes between closely spaced wiring of said wiring layerpreventing etching damage and damage of cracking and delamination to the surface of said passivation layer, further providing a stress buffer to said passivation layer, reducing stress impact on the passivation layer;

patterning and etching said layer of photosensitive polyimide thereby forming a pattern of photosensitive polyimide, said pattern being identical to the pattern of said bond pads, partially removing said photosensitive polyimide from above the surface of said bond pads;

etching said layer of passivation, thereby removing said passivation from above said bond pads, said patterning and etching of said passivation layer to take place after said patterning and etching said layer of photosensitive polyimide; and curing and cross-linking said photosensitive polyimide thereby protecting the underlying circuitry, said curing and cross-linking of said photosensitive polyimide to take place after said etching of said passivation layer.

21. The method of claim 20 wherein said wiring and said plurality of bond pads comprise aluminum.

22. The method of claim 20 wherein said wiring and said plurality of bond pads comprise aluminum/copper (Al/Cu) alloy.

23. The method of claim 20 wherein the thickness of said bond pads is the thickness of said top level metal, said thickness being within the range of between 4000 and 8000 Angstroms.

24. The method of claim 20 wherein said passivation layer is a first passivation layer of Plasma Enhanced oxide deposited to a thickness of about 2000 Angstrom over which a second passivation layer of Plasma Enhanced $Si_3N_4$ is deposited to a thickness of about 7000 Angstrom.

25. The method of claim 20 wherein said patterning said layer of photosensitive polyimide is creating a pattern that is above said plurality of bond pads.

26. The method of claim 20 wherein that portion of said photosensitive polyimide that remains after completion of said patterning and etching said photosensitive polyimide is left in place to serve as a stress buffer and to provide protection against damage and extrusion of that portion of the surface of the passivation layer which is not removed by etching.

27. The method of claim 20 wherein said patterning and etching said passivation layer is removing said passivation layer above and to the top metal of said bond pads.

28. The method of claim 20 wherein a base layer of $SiO_2$ is created on the top surface of said substrate said base layer to be created prior to the creation of said top level metal thereby cushioning the transition of stress between the silicon substrate and said wiring layer.

29. The method of claim 20 wherein said curing and cross-linking said photosensitive polyimide is in a $N_2$ gas ambient at a temperature of between about 300 and 400 degrees C. for a time period between about 1.5 and 2.5 hours.

* * * * *

UNITED STATES PATENT AND TRADEMARK OFFICE
CERTIFICATE OF CORRECTION

PATENT NO. : 6,803,327 B1
DATED : October 12, 2004
INVENTOR(S) : Shih-Shiung Cheu, Yea-Dean Sheu and Chih-Heng Shen It is certified that error appears in the above-identified patent and that said Letters Patent is hereby corrected as shown below:

Title page, Item [54] and Column 1, line 1,
Title, please delete "DELMINATES" and insert -- DELAMINATES --.

Column 10,
Line 27, please delete "layerpreventing" and insert -- layer, preventing --.

Signed and Sealed this

Tenth Day of May, 2005

JON W. DUDAS
*Director of the United States Patent and Trademark Office*